United States Patent
Kanh et al.

(10) Patent No.: US 6,617,085 B1
(45) Date of Patent: Sep. 9, 2003

(54) WET ETCH REDUCTION OF GATE WIDTHS

(75) Inventors: Babar A. Kanh, Ossining, NY (US); Naim Moumen, Wappingers Falls, NY (US); Wesley Charles Natzle, New Paltz, NY (US); Chienfan Yu, Highland Mills, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/223,199

(22) Filed: Aug. 16, 2002

(51) Int. Cl.[7] .......................... G03F 9/00; H01L 21/302
(52) U.S. Cl. .......................... 430/5; 438/725; 438/704; 438/717; 438/750; 438/734; 438/723; 438/719
(58) Field of Search ............................ 430/5; 438/725, 438/704, 717, 750, 734, 723, 719, 753, 756

(56) References Cited

U.S. PATENT DOCUMENTS

| 6,207,496 B1 | * | 3/2001 | Kang | 438/253 |
| 6,432,787 B1 | * | 8/2002 | Mandelman et al. | 438/305 |
| 6,482,726 B1 | * | 11/2002 | Aminpur et al. | 438/585 |

* cited by examiner

*Primary Examiner*—G Goudreau
(74) *Attorney, Agent, or Firm*—Eric W. Petraske

(57) ABSTRACT

A method of forming sublithography gate lengths involves the steps of patterning the layer of resist above the gate stack (including a gate layer, hardmask layer and etch-control layer) to a desired gate length and etching the etch-control layer and the hardmask layer; the portion of the circuit that has the correct gate length is covered with a blocking mask and the hardmask in the remainder is wet-etched to reduce its dimension, after which the gate stack is etched using both gate lengths of hardmask to produce different gate lengths in different areas.

22 Claims, 1 Drawing Sheet

WET ETCH REDUCTION OF GATE WIDTHS

TECHNICAL FIELD

The field of the invention is that of integrated circuit processing in the submicron range.

BACKGROUND OF THE INVENTION

Defining the gate length for a MOSFET integrated circuit involves patterning a layer of material for the gates, usually polycrystalline silicon (poly), as uniformly as possible and usually to as small a dimension as possible, given that the art constantly drives to smaller linewidths.

Some attempts have been made in a hard mask process to define the resist at minimum linewidth and then reduce the resist laterally by a dry etch before etching the hardmask. Other attempts have been made to etch the hard mask and then reduce it laterally before using the hardmask to etch the poly gate layer.

There have been problems with the quality of the edge definition of the hardmask in such approaches.

In addition, there is a geometric problem that applies to circuits including a DRAM array. DRAM cells are very tightly packed, so that when the DRAM gate length is patterned to a dimension that is greater than the final dimension, the rest of the cell must be adjusted to the greater dimension. Then, when the gate length is reduced, there is wasted space in the cell.

The art would benefit from a technique that permitted gates in a DRAM array to be etched to the final dimension and then reduced the gates in the logic regions outside the DRAM array.

SUMMARY OF THE INVENTION

The invention relates to a method of patterning the gate layer on a MOSFET integrated circuit in which the gate stack is first patterned to a gate length appropriate for one portion of the circuit and the remainder of the gates are then reduced in length to a final, smaller, value.

A feature of the invention is the use of a thin layer of silicon to improve the edge definition of the reduced gates in a wet etch.

Another feature of the invention is the use of a wet etch that permits accurate width control.

Another feature of the invention is the reduction of gate lengths uniformly across a circuit.

DETAILED DESCRIPTION

Figure 3:
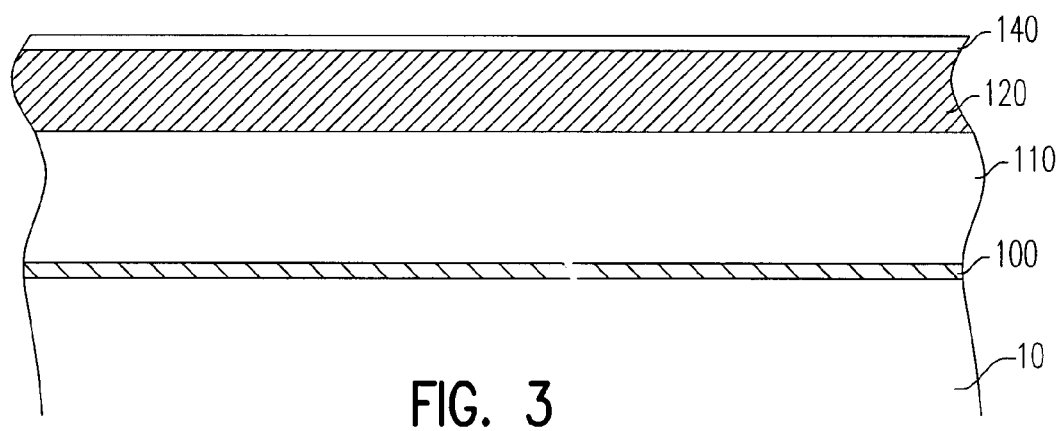
FIG. 3 shows the same area before patterning the hardmask.

Referring now to FIG. 3, there is shown a portion of an integrated circuit with a substrate 10 having a gate insulator 100 formed in it, followed by a poly gate layer 110, an oxide hardmask layer 120 and an etch control layer 140, illustratively of amorphous or poly-silicon. The steps of forming P and N-wells, blanket implants, SOI formation (if used) trench capacitor formation (if used) and other preparatory steps before that shown in FIG. 3 will be referred to collectively for convenience in the claims as "preparing the substrate". Those skilled in the art are aware that some circuits use gate stacks having materials in addition to or instead of poly. A single layer gate stack is used for simplicity in this example.

In this example, the circuit contains an embedded DRAM macro, but the invention may be applied to other types of circuits such as DRAMs and to logic circuits that contain an analog portion or other portions that require a different gate length.

Figure 1:
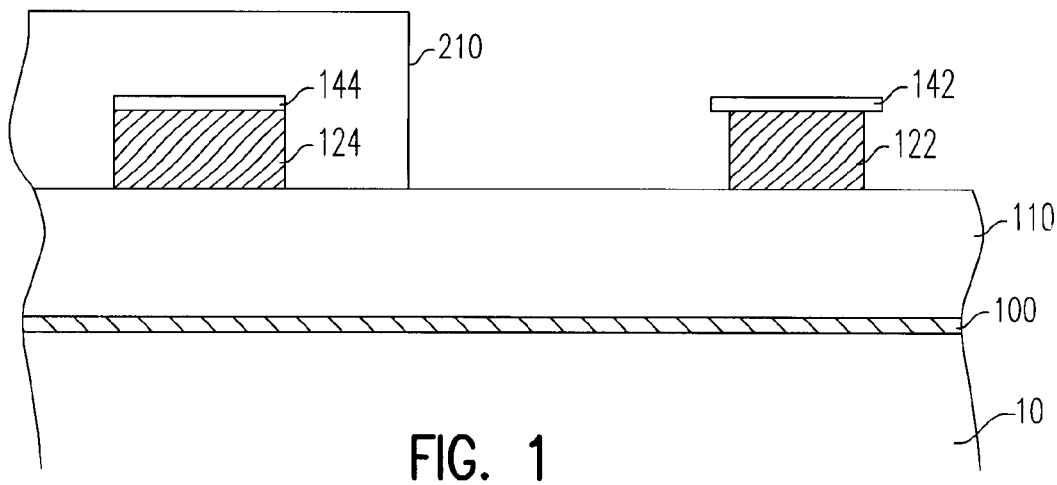
FIG. 1 shows in cross section the result of the mask reduction step.
Figure 2:
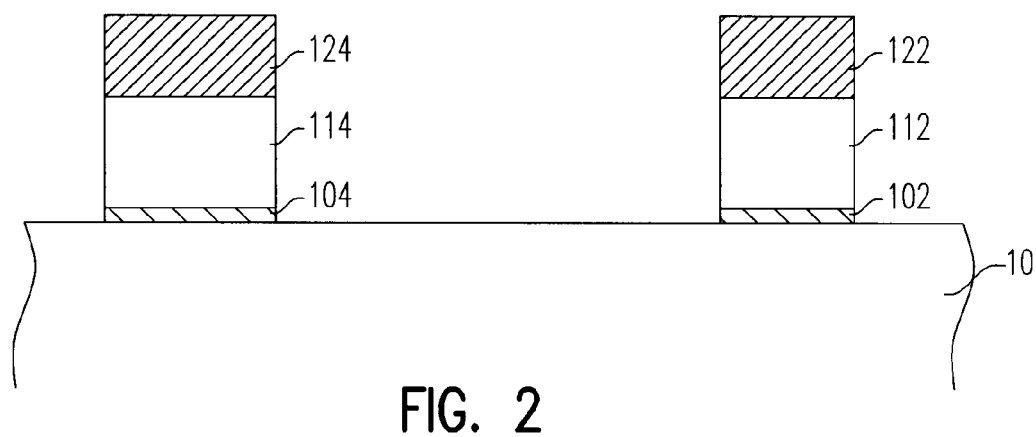
FIG. 2 shows the same area after patterning the gate stack.

FIG. 1 shows the same location after intermediate preparation steps. Layers 120 and 140 (in FIG. 3), referred to together as a "composite hardmask" layer, have been patterned to a gate linewidth (poly 124 and etch control layer 144) suitable for the DRAM array. A directional dry etch (e.g. halogen chemistry) was used to avoid decreasing the nominal dimension. That portion of the circuit has been covered with a blocking mask 210, illustratively of photoresist. On the right, a wet etch, illustratively BHF at 500:1, has been used to attack the hardmask material, leaving a reduced-length gate 122 and an unaffected etch control layer 142. Other combination of materials that are suitable as a hardmask for etching the gate 110 and are resistant to the wet etch used to trim the hardmask may be used. Nitride could be used for layer 120, provided that an additional cleanup step to remove nitride is added later.

In a preferred embodiment, hardmask 120 is oxide deposited by a TEOS (tetra-ethyl ortho silane) based process and etch control layer 140 is either amorphous silicon or polycrystalline silicon. It is believed that the mechanism that produces superior uniformity in the trimming step is that the BHF "wets" both the silicon layers 110 and 140, thus providing uniform lateral etching of the oxide hard mask layer in the reduced mask structure.

Preferably, layer 140 is thin enough that the conventional halogen dry etch chemistry used to pattern poly layer 110 removes it (avoiding the need for additional cleanup) and is thick enough so that it is not damaged by the step of etching layer 120 laterally. Layer 140 is preferably less than 10 nm, illustratively 5 nm.

The preceding discussion has focused on two values for gate length in the critical layer of the gates in a MOSFET circuit, but the method may be used in other situations where it is desired to reduce the linewidth, whether in levels other than the gate level; and uniformly in all regions of a chip or selectively in different portions of a chip. It could also be used in different chips on the same wafer, in the case of a small production run.

Illustratively, for a final width of 50 nm on the reduced gates 122, a thickness of 50 nm for an oxide layer 120, a thickness of 5 nm of amorphous silicon was used for layer 140. In that case, layer 120 was trimmed in 500:1 BHF at a rate of 55 Angstroms/minute, which permits good control of the process at reasonable throughput. A broad range of BHF concentrations is acceptable; e.g. 100:1 to 1000:1.

Those skilled in the art are aware of standard terminology in which a line used for interconnect has a width that may be less than 0.2 micron and a length much greater than that, but a gate has a length (distance between source and drain) that is comparable to the width of an interconnect line. The figures used here follow standard practice and show gates in cross section, with the gate width extending perpendicular to the paper by an amount that depends on the amount of current passing through it. Thus, the following claims have the standard terminology and the term "gate length" refers to the short dimension of a gate extending between source and drain.

While the invention has been described in terms of a single preferred embodiment, those skilled in the art will recognize that the invention can be practiced in various versions within the spirit and scope of the following claims.

What is claimed is:

1. A method of forming an integrated circuit having first gate lengths in a first subcircuit thereof and second gate lengths less than said first gate lengths in a second subcircuit thereof comprising the steps of:

preparing a substrate;

forming a gate stack layer over said substrate and a composite hardmask layer over said gate stack layer, said composite hardmask layer comprising a first hardmask layer and an etch control layer over said hardmask layer; patterning a layer of resist above said gate stack layer with a pattern of a gate layer of said integrated circuit having a first gate length;

etching said composite hardmask layer to transfer said pattern to said hardmask layer;

blocking said first subcircuit with a blocking mask, leaving a set of composite hardmask lines in said second subcircuit;

etching said composite hardmask lines with a wet etch that attacks said first hardmask layer in preference to said etch control layer, whereby said set of hardmask lines have said second gate length less than said first gate length; etching said gate stack using both said first and second gate lengths of hardmask; and completing transistors with gates of said first and second gate lengths and connecting said transistors to form said integrated circuit.

2. A method according to claim 1 in which said first subcircuit is a DRAM array.

3. A method according to claim 1 in which said etch control layer is wetted by the etchant of said wet etch, whereby edges of said hardmask lines are attacked uniformly.

4. A method according to claim 1, in which said hardmask layer is oxide and said etch control layer is silicon.

5. A method according to claim 4, in which said etch control layer is selected from the group comprising amorphous silicon and polycrystalline silicon.

6. A method according to claim 4, in which said etch control layer has a thickness less than 10 nm.

7. A method according to claim 4, in which said wet etch is BHF.

8. A method according to claim 4, in which said wet etch is BHF at 500:1.

9. A method of forming an integrated circuit having first linewidths in a first subcircuit thereof and second linewidths less than said first linewidths in a second subcircuit thereof comprising the steps of forming a layer of line material over a substrate, and a composite hardmask layer over said line material, said composite hardmask layer comprising a first hardmask layer and an etch control layer over said hardmask layer;

patterning a layer of resist above said line material layer with a pattern of a layer of said integrated circuit having a first linewidth;

etching said composite hardmask layer to transfer said pattern to said hardmask layer;

blocking said first subcircuit with a blocking mask leaving a set of composite hardmask lines in said second subcircuit;

etching said composite hardmask lines with a wet etch that attacks said first hardmask layer in preference to said etch control layer, whereby said set of hardmask lines have said second linewidth;

etching said line material using both said first and second linewidths of hardmask; and connecting lines of said first and second linewidths to active devices to form said integrated circuit.

10. A method according to claim 9 in which said etch control layer is wetted by the etchant of said wet etch, whereby edges of said hardmask lines are attacked uniformly.

11. A method according to claim 9, in which said hardmask layer is oxide and said etch control layer is silicon.

12. A method according to claim 11, in which said etch control layer is selected from the group comprising amorphous silicon and polycrystalline silicon.

13. A method according to claim 12, in which said etch control layer has a thickness less than 10 nm.

14. A method according to claim 12, in which said wet etch is BHF.

15. A method according to claim 12, in which said wet etch is BHF at 500:1.

16. A method of forming an integrated circuit comprising the steps of forming a gate stack layer over a substrate, and a composite hardmask layer over said gate stack, said composite hardmask layer comprising a first hardmask layer and an etch control layer over said hardmask layer;

patterning a layer of resist above said gate stack layer with a pattern of a gate layer of said integrated circuit having a first linewidth;

etching said composite hardmask layer to transfer said pattern to said hardmask layer, thereby forming a set of composite hardmask lines;

etching said composite hardmask lines with a wet etch that attacks said first hardmask layer in preference to said etch control layer, whereby said set of hardmask lines have said second linewidth;

etching said gate stack using said second linewidths of hardmask; and completing transistors and connecting said transistors to form said integrated circuit.

17. A method according to claim 16, in which said etch control layer is wetted by the etchant of said wet etch, whereby edges of said hardmask lines are attacked uniformly.

18. A method according to claim 16, in which said hardmask layer is oxide and said etch control layer is silicon.

19. A method according to claim 16, in which said etch control layer is selected from the group comprising amorphous silicon and polycrystalline silicon.

20. A method according to claim 19, in which said etch control layer has a thickness less than 10 nm.

21. A method according to claim 19, in which said wet etch is BHF.

22. A method according to claim 19, in which said wet etch is BHF at 500:1.

* * * * *